United States Patent
Imada et al.

(10) Patent No.: US 7,470,975 B2
(45) Date of Patent: Dec. 30, 2008

(54) COMPOSITION FOR FORMING INSULATION FILM, INSULATION FILM FOR SEMICONDUCTOR DEVICE, AND FABRICATION METHOD AND SEMICONDUCTOR DEVICE THEREOF

(75) Inventors: Tadahiro Imada, Kawasaki (JP); Yoshihiro Nakata, Kawasaki (JP); Yasushi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 11/446,120

(22) Filed: Jun. 5, 2006

(65) Prior Publication Data
US 2007/0197047 A1    Aug. 23, 2007

(30) Foreign Application Priority Data
Feb. 22, 2006   (JP) ............................. 2006-045144

(51) Int. Cl.
*H01L 23/58* (2006.01)
(52) U.S. Cl. .................. 257/638; 257/642; 438/622
(58) Field of Classification Search ............. 257/638, 257/642, 759; 438/622, 778, 782, 783
See application file for complete search history.

(56) References Cited

U.S. PATENT DOCUMENTS

| | | | | |
|---|---|---|---|---|
| 4,914,500 A * | 4/1990 | Liu et al. | .................... | 257/384 |
| 6,423,651 B1 * | 7/2002 | Nakano et al. | .............. | 438/782 |
| 2003/0181537 A1 | 9/2003 | Kirchmeyer et al. | | |
| 2004/0237384 A1 * | 12/2004 | Orr | .............................. | 44/314 |
| 2005/0181633 A1 * | 8/2005 | Hochberg et al. | ........... | 438/787 |
| 2007/0190800 A1 * | 8/2007 | Rantala | ...................... | 438/758 |

FOREIGN PATENT DOCUMENTS

| JP | 2644648 B2 | 8/1997 |
|---|---|---|
| JP | 2003-297819 A | 10/2003 |
| JP | 2005-513777 A | 5/2005 |

* cited by examiner

*Primary Examiner*—Phuc T Dang
(74) *Attorney, Agent, or Firm*—Westerman, Hattori, Daniels & Adrian, LLP.

(57) ABSTRACT

It is an object of the present invention to provide, with good yields, a composition for forming an insulation film which allows obtaining an insulation film for a semiconductor device having a low dielectric constant, excellent stress resistance and excellent crack resistance; an insulation film for a semiconductor device formed from the composition for forming an insulation film; and a high quality and highly reliable semiconductor device fabricated using the insulation film for a semiconductor device. This composition for forming an insulation film comprises a polymer of which the main chain is a chain portion which substantially contains only carbon, silicon and hydrogen, and which contains nitrogen in portions other than the main chain. It is preferable that nitrogen exists as a constituent represented by Formula 1 in the polymer.

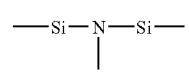

(1)

20 Claims, 7 Drawing Sheets

STEP 1

STEP 2

STEP 3

STEP 1

STEP 2

STEP 3

STEP 4

STEP 5

STEP 6

STEP 7

STEP 8

STEP 9

STEP 10

STEP 11

STEP 12

STEP 13

STEP 14

STEP 15

STEP 16

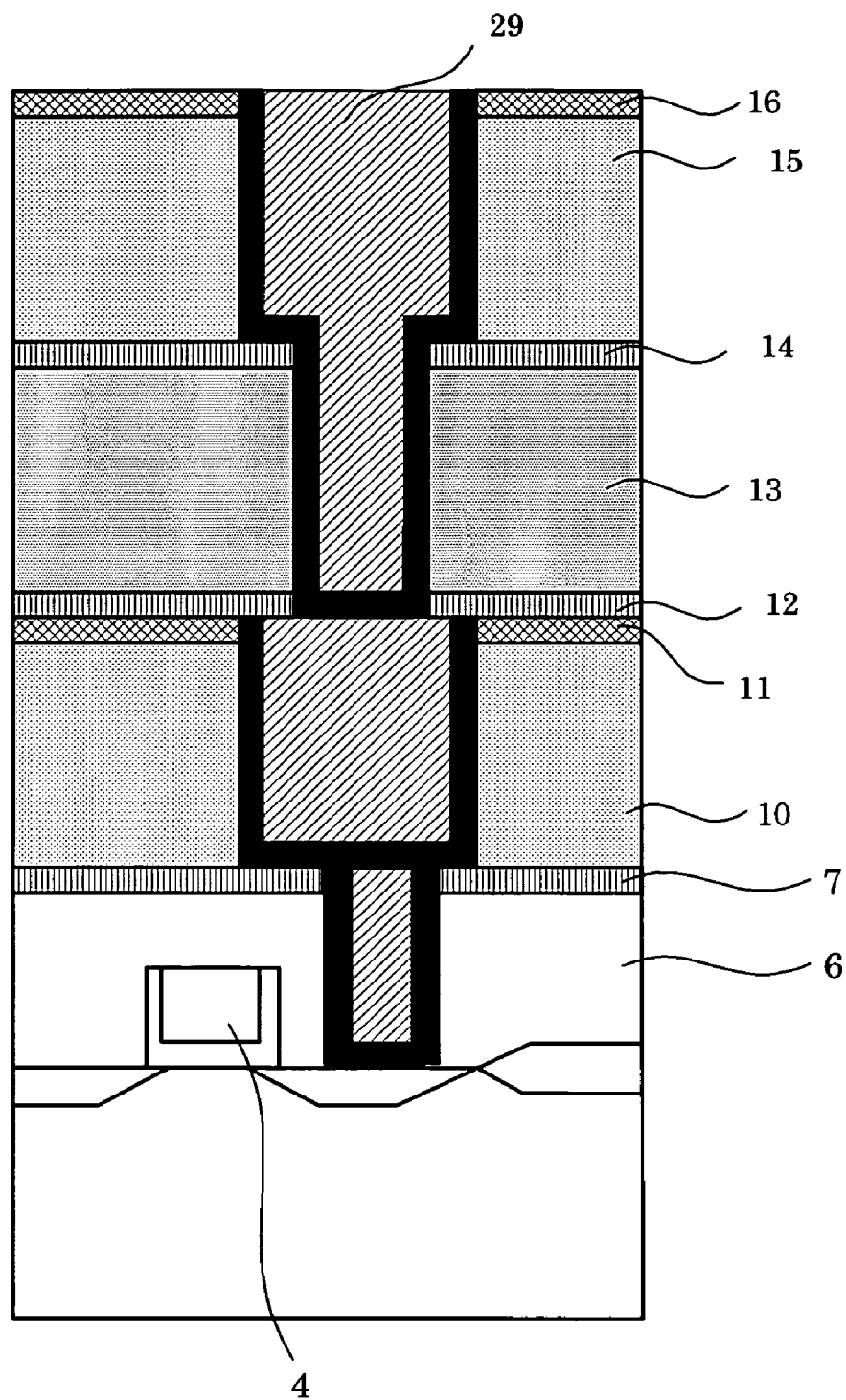
FIG. 7   STEP 17

COMPOSITION FOR FORMING INSULATION FILM, INSULATION FILM FOR SEMICONDUCTOR DEVICE, AND FABRICATION METHOD AND SEMICONDUCTOR DEVICE THEREOF

CROSS-REFERENCE TO RELATED APPLICATIONS

This application is based upon and claims the benefit of priority from the prior Japanese Patent Application No. 2006-45144, filed on Feb. 22, 2006, the entire contents of which are incorporated herein by reference.

BACKGROUND OF THE INVENTION

1. Field of the Invention

The present invention relates to a composition for forming an insulation film that can form a coating film which excels in low dielectric constant, crack resistance and stress resistance, and an insulation film for a semiconductor device using this composition.

2. Description of the Drawing

A drop in the signal propagation speed by the parasitic capacity of an insulation film for a semiconductor device has been known, but the line delay did not have a major influence on an entire device at the generation in which the line space of a semiconductor device exceeds 1 μm. But the influence on the device speed becomes major when the line space is 1 μm or less, and in particular the influence of the parasitic capacity between the lines on the device speed will be significant if circuits are formed with a 0.1 μm or less line space in the future.

As the degree of integration of semiconductor integrated circuits increases and device density improves, the demand for multi-layer semiconductor devices is increasing, particularly. In this trend, the line space is becoming smaller, for example, due to the higher degree of integration, and the line delay caused by the increase in capacity between lines is becoming a problem. The line delay (T) is influenced by the line resistance (R) and the capacity between lines (C), and is given by the following Formula 7.

$$T \propto CR \quad (7)$$

In Formula 7, the relationship of $\in$ (dielectric constant) and C is shown in Formula 8.

$$C = \in_o \in_r S/d \quad (8)$$

(where S is an electrode area, $\in_o$ is the dielectric constant of a vacuum, $\in_r$ is the dielectric constant of an insulation film, and d is a line space.) Therefore in order to decrease the line delay, decreasing the dielectric constant of an insulation film is effective. So in order to decrease the dielectric constant of an insulation film, an organic insulation film is used, or voids are introduced into the insulation film. For example, nano-clustering silica (NCS), made by Shokubai Kasei Industry (product name: Celamate NCS), is used. In such an insulation film material, clustering silica is formed using a quaternary alkyl amine as a catalyst. Also a low dielectric constant insulation film having an SiO bonding as the skeletal structure is formed by CVD or the like.

In this way, the skeletal structure of such low dielectric constant insulation films is, in many cases, SiO bonding. However, since copper as a material for wirings comes into an insulation film of which the skeletal structure is an SiO bonding, a barrier insulation film is required to be a cap of copper wires.

However the relative dielectric constant of a conventional cap insulation film by CVD is high, which interferes in further decreasing the dielectric constant of the insulation film. In the case of a coating type film by a spin counter, the relative dielectric constant can be decreased by using a polymer material for the insulation film, but the strength is not sufficient, which tends to cause a breakdown in the insulation film during a process where stress is applied, such as the chemical mechanical polishing (CMP) process, and the wire bonding process to connect electrodes to pads, and this insufficient stress resistance is a major cause in the drop in yield and reliability.

After serious research to solve these problems, it was found that a relative dielectric constant as low as 3.0 and a 10 GPa or more Young's modulus can be implemented if a method of forming a cap insulation film by the spin coat method and improving the strength by irradiating electron beams {see Japanese Unexamined Patent Application Publication No. 2003-297819 (Claims)}, a method of improving the strength by attaching a functional group which is condensed with the side chains to form cross-links {Japanese Published Patent Application No. 2005-513777 (Claims)}, etc. are provided.

However as a result of repeated testing to form a low dielectric constant silica type film on various semiconductor substrates using these methods and a conventionally known film forming method (spin coat method and other coating methods), it was discovered that a film having the above mentioned characteristics can be obtained, but cracks tend to occur probably due to the shrinking of film when about 50 nm of film, which is the actual film thickness used as a cap film, is being formed.

With the foregoing in view, it is an object of the present invention to provide a material for an insulation film which has a low dielectric constant, excellent stress resistance having sufficient strength, and excellent crack resistance by suppressing shrinkage during film formation. Other objects and advantages of the present invention will be clarified by the following description.

SUMMARY OF THE INVENTION

According to one aspect of the present invention, a composition for forming an insulation film comprising a polymer of which the main chain is a chain portion substantially containing only carbon, silicon and hydrogen, and which contains nitrogen in portions other than the main chain, is provided. If the composition for forming an insulation film according to the present invention is used, an insulation film for a semiconductor device, which has a low dielectric constant and has an excellent stress resistance and excellent crack resistance, can be obtained.

It is preferable that the nitrogen exists as a constituent represented by Formula 1 in the polymer;

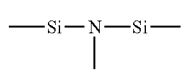

(1)

that the molar ratio of the nitrogen and silicon in the polymer is in the range of $0.1 \leq N/Si \leq 0.5$; that the composition comprises at least one of a silicon-containing polymer having a repeating unit represented by Formula 2, and a silicon-con taining polymer having a repeating unit represented by Formula 3,

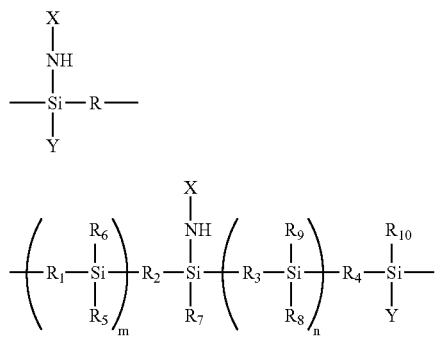

(where R and $R_1$ to $R_4$ in Formula 2 and Formula 3 are, independently from each other, an alkylene group with a carbon number of 1 to 20, an alkenylene group or alkynylene group with a carbon number of 2 to 20, an alkenylalkylene group or alkynylalylene group with a carbon number of 3 to 20, or an arylene group with a carbon number of 6 to 20; $R_5$ to $R_{10}$ are, independently from each other, hydrogen, an alkyl group with a carbon number of 1 to 20, an alkenyl group or alkynyl group with a carbon number of 2 to 20, an alkenylalkyl group or alkynylalkyl group with a carbon number of 3 to 20, or an aryl group with a carbon number of 6 to 20; m and n are, independently from each other, an integer in a range of 0 to 20; X is hydrogen or a silicon-containing group which directly bonds with a corresponding NH, independently between Formula 2 and Formula 3; and Y is $NH_2$ or an NH-containing group which directly bonds with a corresponding Si, independently between Formula 2 and Formula 3); that $R_1$ to $R_4$ in Formula 3 are, independently from each other, an alkylene group with a carbon number of 1 to 3, an alkenylene group or alkynylene group with a carbon number of 2 to 4, an alkenylalkylene group or alkynylalkylene group with a carbon number of 3 to 6, or an arylene group with a carbon number of 6 to 10; that $R_5$ to $R_{10}$ in Formula 3 are, independently from each other, an alkyl group with a carbon number of 1 to 3, an alkenyl group or alkynyl group with a carbon number of 2 to 4, an alkenylalkyl group or alkynylalkyl group with a carbon number of 3 to 6, or an aryl group with a carbon number of 6 to 10; and that m and n in Formula 3 are, independently from each other, an integer in a range of 0 to 10.

According to another aspect of the present invention, an insulation film forming method for a semiconductor device, comprising: coating the above composition for forming an insulation film on a silicon substrate; and heating the silicon substrate at 80 to 500° C. for 2 to 180 minutes, is provided. By this aspect of the invention, an insulation film for a semiconductor device, which has a low dielectric constant and has an excellent stress resistance and excellent crack resistance, can be obtained.

It is preferable that at least a part of the heating is performed in an atmosphere containing oxygen and steam; that the oxygen concentration in the atmosphere is in the range of 100 volume ppm to 40 volume %; more particularly that the oxygen concentration in the atmosphere is in a range of 1 to 20 volume %; that the steam concentration in the atmosphere is in a range of 10 volume ppm to 4 volume %; and more particularly that the steam concentration in the atmosphere is in a range of 100 volume ppm to 1 volume %.

According to other aspects of the present invention, an insulation film for a semiconductor device obtained by heating the composition for forming an insulation film, and an insulation film for a semiconductor device formed by the insulation film forming method for a semiconductor device, are provided. The insulation films for a semiconductor device according to these aspects of the present invention have a low dielectric constant, and have an excellent stress resistance and excellent crack resistance.

It is preferable that the insulation film for a semiconductor device is an inter-layer film. It is also preferable that the oxygen content in the composition is in a range of 1 to 50 molar %, and that the relative dielectric constant is 3.0 or less, and the Young's modulus is 10 GPa or more.

According to still other aspects of the present invention, a semiconductor device fabrication method comprising: forming an insulation film for a semiconductor device using the above method; and then polishing wirings of the semiconductor device by CMP, and a semiconductor device fabrication method comprising: forming an insulation film for a semiconductor device using the above method; and forming an insulation film of which the relative dielectric constant is 2.5 or less immediately before or immediately after forming the insulation film, are provided. By these aspects of the present invention, high quality and highly reliable semiconductor devices can be fabricated with an excellent yield.

It is preferable that the insulation film of which the relative dielectric constant is 2.5 or less is formed by processes including coating a liquid composition comprising an organosilicon compound obtained by hydrolysis in the presence of a tetraalkylammonium hydroxide (TAAOH) onto a substrate, and heating the substrate at a temperature in an 80 to 450° C. range.

According to still other aspects of the present invention, a semiconductor device fabricated by the fabrication method, and a semiconductor device wherein the insulation film for a semiconductor device and an insulation film of which the relative dielectric constant is 2.5 or less are layered, are provided. By these aspects of the present invention, high quality and highly reliable semiconductor devices can be obtained.

It is preferable that the insulation film of which the relative dielectric constant is 2.5 or less is formed by processes including coating a liquid composition comprising an organosilicon compound obtained by hydrolysis in the presence of a tetraalkylammonium hydroxide (TAAOH) onto a substrate, and heating the substrate at a temperature in an 80 to 450° C. range.

By the present invention, an insulation film for a semiconductor device having a low dielectric constant and having an excellent stress resistance and excellent crack resistance can be obtained. Therefore high quality and highly reliable semiconductor devices can be obtained with an excellent yield.

BRIEF DESCRIPTION OF THE DRAWINGS

FIG. 7 is a schematic diagram (cross-sectional view) depicting a fabrication method of an example of multi-layer wirings according to the present invention.

DESCRIPTION OF THE PREFERRED EMBODIMENTS

Figure 1:
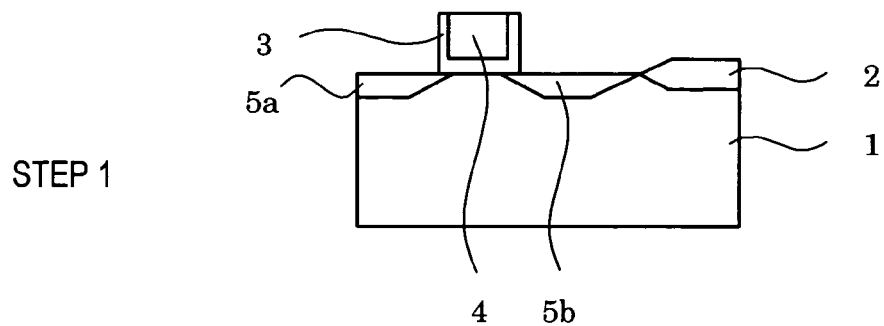
FIG. 1 shows schematic diagrams (cross-sectional views) depicting a fabrication method of an example of multi-layer wirings according to the present invention.
Figure 1:
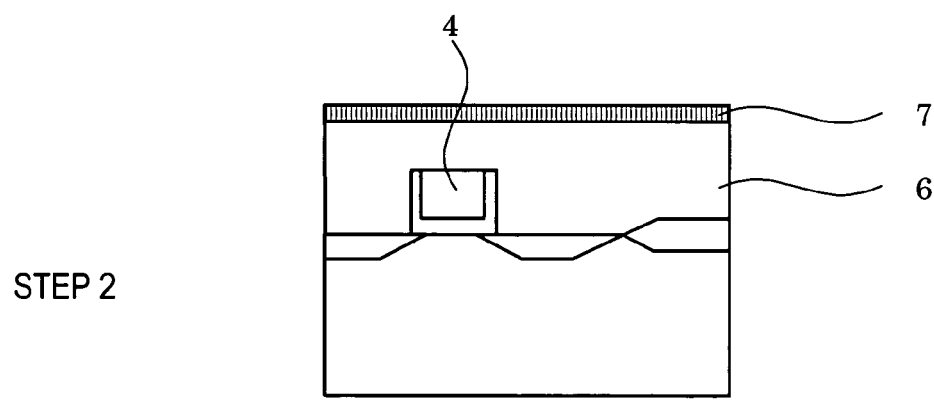
Figure 1:
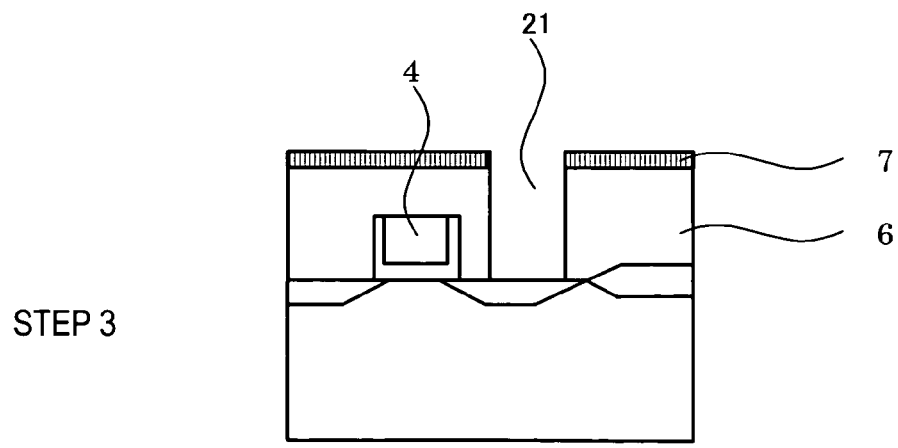

Embodiments of the present invention will now be described with reference to the drawings, tables, formulas and examples. These drawings, tables, formulas, examples and description are for illustrating the present invention, and not for limiting the scope of the present invention. Needless to say, other embodiments belong to the category of the present invention as long as they conform to the essential character of the present invention. The same elements in the drawings are denoted with the same reference numbers.

The composition for forming an insulation film according to the present invention comprises a polymer, of which the main chain is a chain portion which substantially contains only carbon, silicon and hydrogen, and which contains nitrogen in the portions other than the main chain.

The insulation film according to the present invention refers to an insulator film used for arbitrary locations of a device to prevent mutual electric contact between conductors. The device is mainly a semiconductor device, but includes devices referred to by other names. If the insulation film is used for a semiconductor device, the insulation film according to the present invention is called an insulation film, insulation layer, inter-layer film, inter-layer insulation film, inter-layer insulation layer, cap layer, etching stopper layer, etc., and may also have functions other than the insulation function, such as a function to prevent the migration of a wiring metal or the like and a function as an etching stopper.

The composition for forming an insulation film according to the present invention includes a composition comprising a plurality of types of the above mentioned polymer, and a composition comprising other components. As the other components, any substance may be used as long as it conforms to the essential character of the present invention, but solvents are most commonly used. By using a solvent, an insulation film can be formed more easily. Solvents that can be used are not particularly limited either, and an appropriate one can be chosen from the known solvents. A method for forming the insulation film is not particularly limited, and may be selected from the known methods, but such a coating method as spin coating is generally preferable.

In the present invention, "the main chain is a chain portion which substantially contains only carbon, silicon and hydrogen" means having a so-called polycarbosilane structure as a main structure. The phrase "substantially contains only carbon, silicon and hydrogen" means that in the atoms constituting the main chain of this polymer, the concentration of elements other than carbon, silicon and hydrogen that could exist is 1 molar % or less. This concentration is preferably 0.5 molar % or less, and even more preferably 0.2 molar % or less. A possible element other than carbon, silicon and hydrogen that could exist is oxygen.

It is a condition for the main chain according to the present invention that it substantially contains only carbon, silicon and hydrogen, regardless the chain length. If there are a plurality of chain portions substantially containing only carbon, silicon and hydrogen, then arbitrary one can be used as a main chain. The main chain length may be shorter than the side chain length. If the main chain is too short, curing may become insufficient, so it is preferable that the number of carbon and silicon in a main chain per molecule is 10 or more respectively. The upper limit is not particularly set, but if it is too high, the film forming performance by coating drops, so it is preferable that the numbers of carbon and silicon in a main chain are each 100 or less.

A composition comprising a polymer of which the main chain substantially contains only carbon, silicon and hydrogen and which contains nitrogen in the portions other than the main chain does not shrink, or shrinks little during film formation, therefore cracks hardly occur to the obtained insulation film, and a desired strength can easily be implemented. Not shrinking or hardly shrinking during film formation is probably because the bonding related to the nitrogen in the polymer is broken by thermal processing or the like during the insulation film formation, generating bonds related to oxygen, and shrinking of the entire system is suppressed or the entire system is expanded when curing is in progress.

It is preferable that nitrogen exists in the polymer as a constituent given by Formula 1. The group that bonds with the bonding hand coming out of nitrogen downward in Formula 1 is not particularly limited, and hydrogen, silicon or carbon, for example, can be used. When it bonds with silicon or carbon, the silicon or carbon may compose a part of the "polymer structure of which the main chain substantially contains only carbon, silicon and hydrogen", or the "polymer structure of which the main chain substantially contains only carbon, silicon and hydrogen, and nitrogen is contained in portions other than the main chain".

The structure represented by Formula 1 is a so-called silazane structure. The silazane structure turns into a structure represented by Formula 4 to be cured if it is heated in an atmosphere containing oxygen and water, so shrinking is suppressed when curing progresses, and the generation of cracks can be suppressed. Nitrogen normally turns into ammonia which is released from the system.

In the case of the bonding in Formula 5 as well, a structure represented by Formula 4 is formed and is cured if it is heated in an atmosphere containing oxygen and water, but compared with the silazane structure, the reactivity with water and oxygen is weak, and the progress of reaction inside the film is particularly slow.

If there are two bondings represented by Formula 6, they turn into a structure represented by Formula 4 and is cured if they are heated in an atmosphere containing oxygen and water in the same way as above, but shrink during curing due to the volume changes, so cracks occur easily.

In the case where silicon atoms have a hydrocarbon group or the like such as a methyl group, ethyl group, phenyl group or the like, the structure represented by Formula 4 is generated and is cured if it is heated in an atmosphere containing oxygen and water, just like the above case, but the structure shrinks during curing, just like the case of bonding represented by Formula 6, so cracks occur easily.

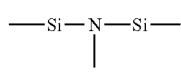

(1)

(4)

-continued

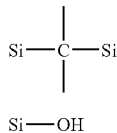

(5)

(6)

Regarding the polymer in the composition for forming an insulation film, it is preferable that the molar ratio of the atoms is $0.1 \leq N/Si \leq 0.5$. If N/Si is less than 0.1, the quantity of the Si—O bonding to be formed is low, and the strength tends to be insufficient. If N/Si is greater than 0.5, the quantity of the Si—O bonding to be formed is too high, so the relative dielectric constant tends to become too large.

It is preferable that the polymer is at least one of a silicon-containing polymer having a repeating unit represented by Formula 2, and a silicon-containing polymer having a repeating unit represented by Formula 3.

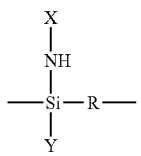

(2)

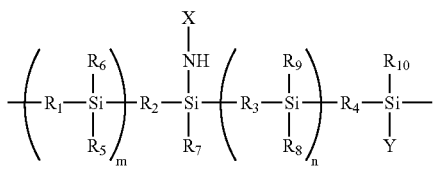

(3)

(where R and $R_1$ to $R_4$ in Formula 2 and Formula 3 are, independently from each other, an alkylene group with a carbon number of 1 to 20, an alkenylene group or alkynylene group with a carbon number of 2 to 20, an alkenylalkylene group or alkynylalkylene group with a carbon number of 3 to 20, or an arylene group with a carbon number of 6 to 20; $R_5$ to $R_{10}$ are, independently from each other, hydrogen, an alkyl group with a carbon number of 1 to 20, an alkenyl group or alkynyl group with a carbon number of 2 to 20, an alkenylalkyl group or alkynylalkyl group with a carbon number of 3 to 20, or an aryl group with a carbon number of 6 to 20; m and n are, independently from each other, an integer in a range of 0 to 20; X is hydrogen or a silicon-containing group which directly bonds with a corresponding NH, independently between Formula 2 and Formula 3; and Y is $NH_2$ or an NH-containing group which directly bonds with a corresponding Si, independently between Formula 2 and Formula 3).

The above condition is preferable because it is important that the cross-linking location by Si—O—Si bonding should be distributed to effectively improve the strength without increasing the relative dielectric constant, and also to have a barrier property against copper diffusion. The molecular weight is not particularly limited, but it is preferable to be in a range with which when the composition is dissolved in a solvent, a viscosity appropriate for spin coating can be implemented and an appropriate film thickness is obtained, since it is preferable that spin coating is possible from the practical viewpoint.

For X, the "corresponding NH" indicates the NH directly below X in Formulas 2 and 3. The silicon-containing group in "silicon-containing group directly bonded to the corresponding NH" is not particularly limited, but a preferable example is a "polymer structure of which the main chain substantially contains only carbon, silicon and hydrogen", or a "polymer structure of which the main chain substantially contains only carbon, silicon and hydrogen, and which contains nitrogen in portions other than the main chain". Similarly, for Y, the "corresponding Si" indicates the Si directly above Y in Formulas 2 and 3. The NH-containing group in the "NH-containing group directly bonded to the corresponded Si" is not particularly limited, but a preferable example is a structure where NH is bonded to a "polymer structure of which the main chain substantially contains only carbon, silicon and hydrogen", or a "polymer structure of which the main chain substantially contains only carbon, silicon and hydrogen, and which contains nitrogen in portions other than the main chain".

In terms of relative dielectric constant and Young's modulus, it is preferable that in Formula 3, $R_1$ to $R_4$ are, independently from each other, an alkylene group with a carbon number of 1 to 3, an alkenylene group or alkynylene group with a carbon number of 2 to 4, an alkenylalkylene group or alkynylalkylene group with a carbon number of 3 to 6, or an arylene group with a carbon number of 6 to 10; that $R_5$ to $R_{10}$ are, independently from each other, an alkyl group with a carbon number of 1 to 3, an alkenyl group or alkynyl group with a carbon number of 2 to 4, an alkenylalkyl group or alkynylalkyl group with a carbon number of 3 to 6, or an aryl group with a carbon number of 6 to 10; and that m and n are, independently from each other, an integer in a range of 0 to 10.

To form an insulation film for a semiconductor device from the above mentioned composition for forming an insulation film, the composition for forming an insulation film may be heated. Specifically, the composition for forming an insulation film may be coated on a silicon substrate, and this silicon substrate is heated at 80 to 500° C. for 2 to 180 minutes.

By such steps, insulation films which excel in low dielectric constant, excellent crack resistance and excellent stress resistance, can be formed. It is preferable that the heating processing is performed at a temperature that is increased gradually or in steps, rather than at a constant temperature. An example is a method of performing heating processing with a temperature increase in two steps.

Curing becomes insufficient if the temperature is lower than the above temperature range, and the hydrocarbon group may be oxidized if the temperature is higher than the above temperature range. Curing becomes insufficient if the heating processing time is shorter than the above mentioned heating processing time range. If it is longer than the above heating processing time range, the insulation film thus generated has no problems, but the entire process time could be increased.

At least a part of the heating processing should be performed in an atmosphere containing oxygen and steam. In some cases, using ordinary air may be sufficient, but in many cases it is preferable to adjust the concentration of steam and oxygen artificially. An example of performing at least a part of the heating processing in an atmosphere containing oxygen and steam is a case of applying this condition only to the latter half of heating processing which is separated into two steps.

By using an atmosphere containing oxygen and steam, the bonding shown in Formula 1 changes into the bonding shown in Formula 4, and crack resistance and stress resistance improve. At this time it is preferable that the oxygen concentration is in a 100 volume ppm to 40 volume % range to improve the characteristics. It is more preferable that the concentration is in a 1 to 20 volume % range since time-based reaction control is easier. If the concentration is less than 100 volume ppm, the effect is insufficient, and the stress resistance could be insufficient. The merits in the characteristics do not improve much even if the concentration exceeds 40 volume %.

It is preferable that the steam concentration is in a 10 volume ppm to 4 volume % range to improve the characteristics. It is more preferable that the concentration is in a 100 volume ppm to 1 volume % range since time-based reaction control is easier. If the concentration is less than 10 volume ppm, the substitution of nitrogen with oxygen could become insufficient. The merits in the characteristics do not improve much even if the concentration exceeds 4 volume %.

In this way, the insulation film for a semiconductor device can be obtained. In terms of composition after heating this insulation film for a semiconductor device, it is preferable that the oxygen content is in a range of 1 to 50 molar % range. If it is less than 1 molar %, curing is insufficient, and the stress resistance could be insufficient. If 50 molar % is exceeded, the relative dielectric constant could be high.

As described above, this insulation film for a semiconductor device can implement excellent crack resistance and excellent stress resistance, and low dielectric constant. For example, a film which does not crack during film formation and has a relative dielectric constant of 3.0 or less and a Young's modulus of 10 GPa or more can be obtained. Since this film of which the relative dielectric constant is low can function as a copper diffusion barrier, it can also be favorably used as an inter-layer film and cap layer of wirings. This film can also be used as an etching stopper, since the etching rate is different from a silica-type insulation film.

The insulation film fabrication method for a semiconductor device can be favorably used for fabricating semiconductor devices.

In terms of utilizing the improved stress resistance of an insulation film for a semiconductor device according to the present invention, it is preferable that the insulation film for a semiconductor device is formed using the above method when the insulation film is formed first, and then the wirings of a semiconductor device are polished by CMP.

In terms of utilizing the improved crack resistance and stress resistance of an insulation film for a semiconductor device according to the present invention, it is also preferable that an insulation film, which has a relative dielectric constant equivalent to or less than that of the insulation film for a semiconductor device according to the present invention, is used together with the insulation film for a semiconductor device according to the present invention when a semiconductor device is fabricated. More specifically, it is preferable that an insulation film for a semiconductor device is formed by the above mentioned method, and immediately before or immediately after that, an insulation film of which the relative dielectric constant is 2.5 or less is formed. Or it is preferable that in the semiconductor device, the above insulation film for a semiconductor device and an insulation film having a relative dielectric constant equivalent to or less than that of the insulation film for a semiconductor device according to the present invention, particularly an insulation film of which the relative dielectric constant is 2.5 or less, are layered.

An insulation film of which the relative dielectric constant is equivalent to or less of the insulation film for a semiconductor device according to the present invention is generally made of an organosilicon compound, and has a low crack resistance and stress resistance, but by using the insulation film for a semiconductor device according to the present invention together with this insulation film, the relative dielectric constant of an entire semiconductor device can be minimized, and also the crack resistance and stress resistance of an entire device can be improved, therefore a high quality and highly reliable device can be implemented.

A typical example of an insulation film of which the relative dielectric constant is 2.5 or less is a film formed by the processes comprising: coating a liquid composition, comprising an organosilicon compound obtained by hydrolysis in the presence of a tetraalkylammonium hydroxide (TAAOH), on a substrate; and heating this substrate at a temperature in an 80 to 450° C. range. It is preferable to perform this heating at a temperature that is increased gradually or in steps, rather than at a constant temperature. An example is a method of performing heating with a temperature increase in two steps.

By using a composition for forming an insulation film according to the present invention, an insulation film for a semiconductor device which has a low dielectric constant and has an excellent stress resistance and crack resistance, can be provided, and by this, the reliability of highly integrated semiconductor devices, such as ICs and LSIs, for example, can be increased.

EXAMPLES

Now examples of the present invention and comparative examples will be described. The relative dielectric constant was calculated from the capacity measured with a mercury probe (CVmap 92A, Four Dimensions, Inc.), and Young's modulus was measured by an indentation method (Nano Identifier XP, Nano Instrument, Co.).

Example 1

Compositions for forming an insulation film (average molecular weight: 1400) comprised of polymers having structures where m=n=0 to 10 in Formula 2 and Formula 3 (wherein X was a polymer structure of which the main chain was a chain portion substantially containing only carbon, silicon and hydrogen, and containing nitrogen in portions other than the main chain; Y was NH; R, $R_1$ to $R_4$ were all $CH_2$; and $R_5$ to $R_{10}$ were all $CH_3$) were used respectively. They were spin coated on low resistance substrates to be a 200 nm film thickness, the substrates were prebaked (heating) in a nitrogen atmosphere at 250° C. for three minutes, then heated in an electric furnace in an atmosphere of gas in which oxygen was 5 volume %, steam was 1000 volume ppm, and the rest was nitrogen, at 400° C. for thirty minutes. Cracking did not occur under any of these conditions.

Table 1 shows the characteristics of the obtained films.

TABLE 1

| Number | Material | Relative dielectric constant | Young's modulus (GPa) |
|---|---|---|---|
| 1 | Formula (2) | 3.5 | 21 |
| 2 | Formula (3), m = n = 0 | 3.0 | 17 |
| 3 | Formula (3), m = n = 1 | 2.8 | 15 |
| 4 | Formula (3), m = n = 2 | 2.7 | 14 |
| 5 | Formula (3), m = n = 3 | 2.6 | 13 |
| 6 | Formula (3), m = n = 4 | 2.6 | 12 |
| 7 | Formula (3), m = n = 5 | 2.5 | 12 |
| 8 | Formula (3), m = n = 6 | 2.5 | 11 |
| 9 | Formula (3), m = n = 7 | 2.5 | 11 |
| 10 | Formula (3), m = n = 8 | 2.5 | 10 |
| 11 | Formula (3), m = n = 9 | 2.5 | 10 |
| 12 | Formula (3), m = n = 10 | 2.4 | 9 |

Example 2

A composition for forming an insulation film (average molecular weight: 1400) comprised of a polymer having a structure of m=n=3 in Formula 3 according to Example 1 was spin coated on low resistance substrates to be a 200 nm film thickness, then the substrates were prebaked in a nitrogen atmosphere at 250° C. for three minutes, and then heated in an electric furnace in an atmosphere shown in Table 2 at 400° C. for thirty minutes.

Table 2 shows the characteristics of the obtained films. The concentrations of oxygen and steam in the heating processing were as shown in Table 2.

TABLE 2

| Oxygen concentration (volume %) | Steam concentration (volume ppm) | Relative dielectric constant | Young's modulus (GPa) |
|---|---|---|---|
| 0.2 | 1,000 | 2.5 | 9 |
| 1 | 100 | 2.5 | 10 |
|  | 1,000 | 2.5 | 10 |
|  | 10,000 | 2.7 | 12 |
| 5 | 10 | 2.6 | 9 |
|  | 100 | 2.6 | 10 |
|  | 1,000 | 2.6 | 13 |
|  | 10,000 | 2.9 | 15 |
|  | 100,000 | 3.2 | 18 |
| 20 | 100 | 2.8 | 14 |
|  | 1,000 | 2.9 | 15 |
|  | 10,000 | 3.0 | 17 |
| 50 | 1,000 | 3.5 | 21 |

Example 3

Figure 2:
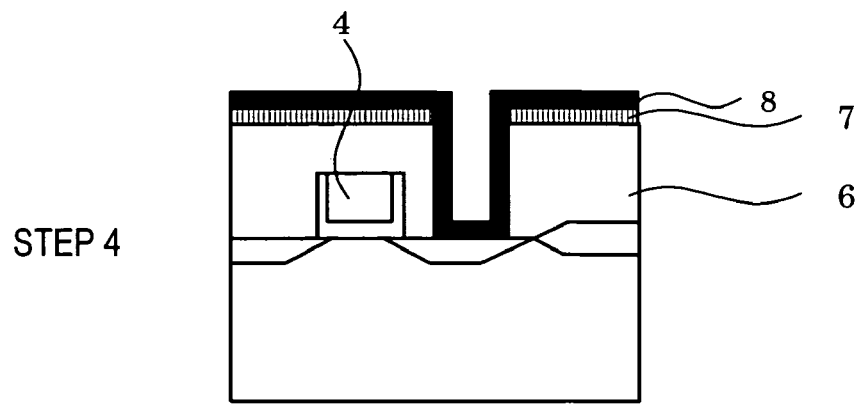
FIG. 2 are schematic diagrams (cross-sectional views) depicting a fabrication method of an example of multi-layer wirings according to the present invention.
Figure 2:
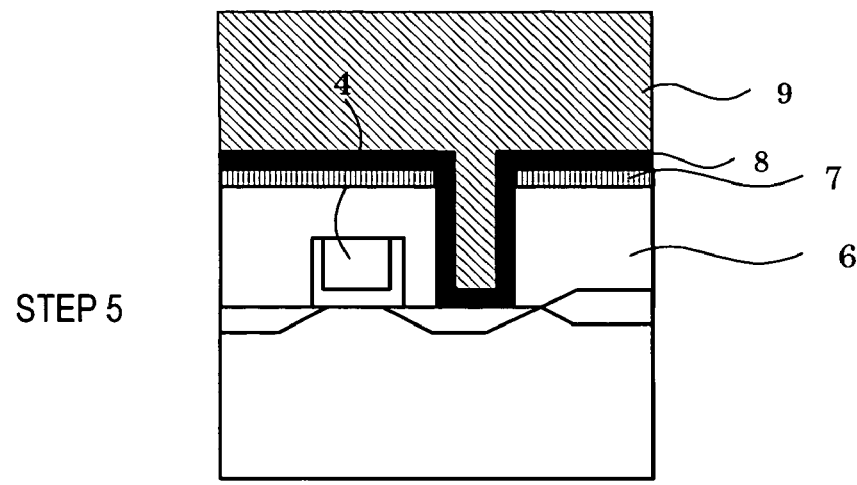
Figure 2:
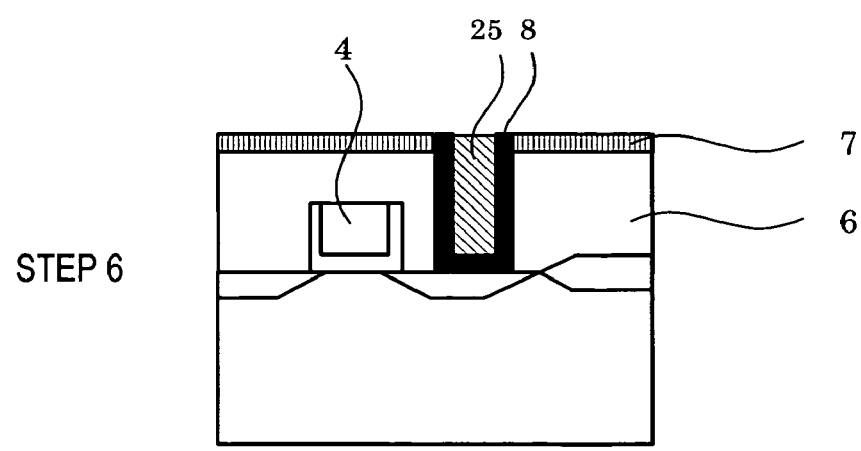
Figure 3:
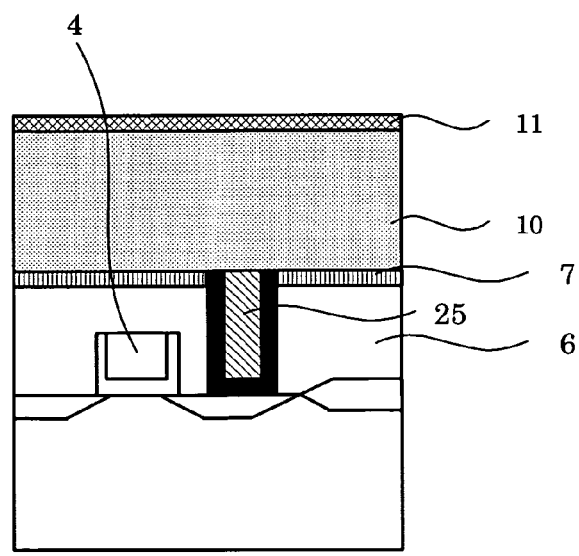
FIG. 3 are schematic diagrams (cross-sectional views) depicting a fabrication method of an example of multi-layer wirings according to the present invention.
Figure 3:
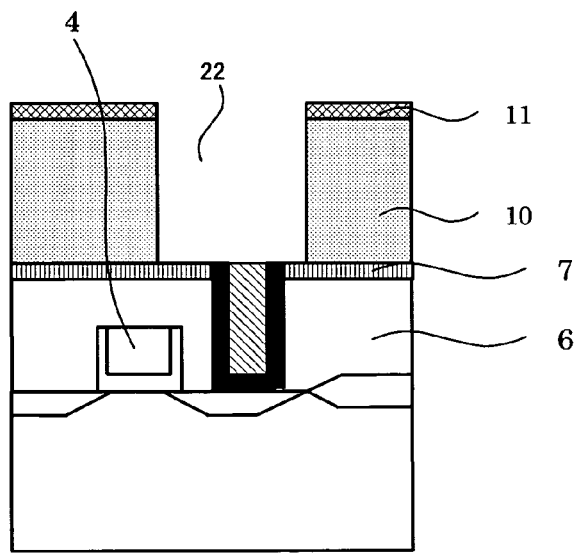
Figure 3:
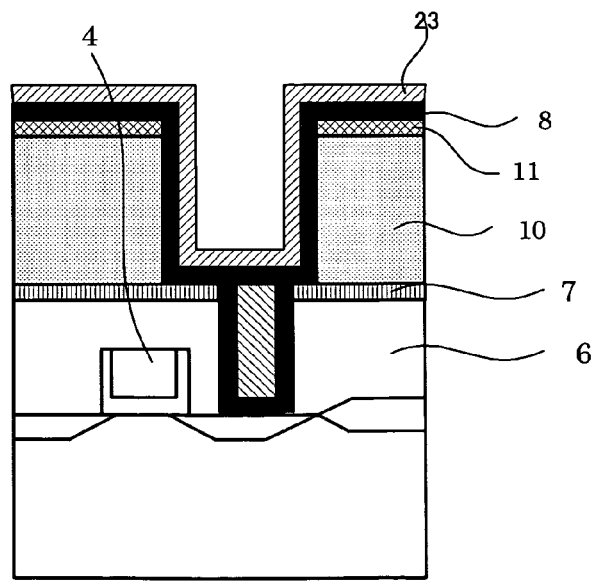
Figure 4:
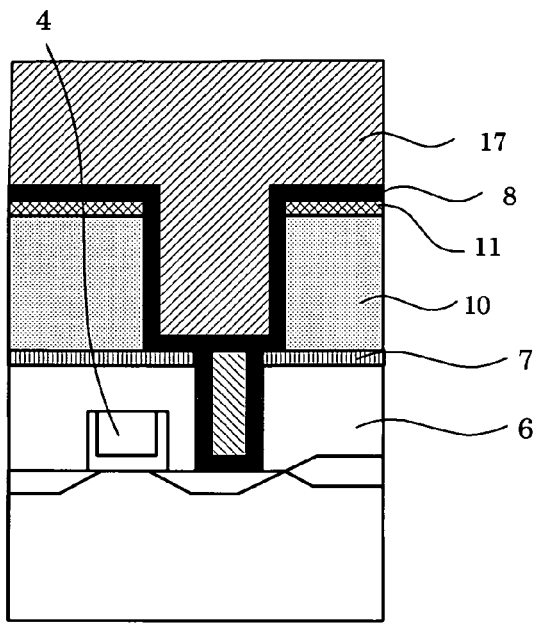
FIG. 4 are schematic diagrams (cross-sectional views) depicting a fabrication method of an example of multi-layer wirings according to the present invention.
Figure 4:
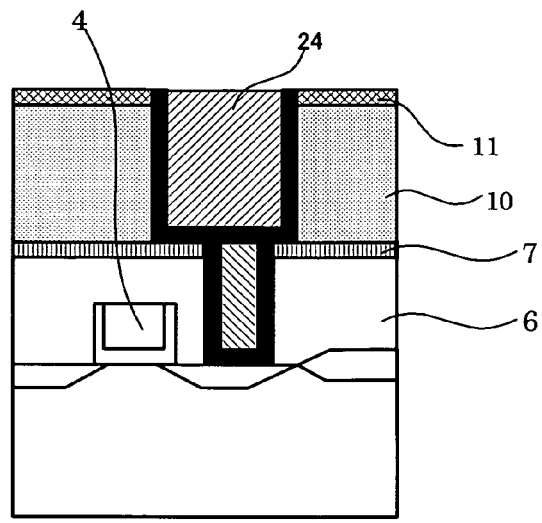
Figure 4:
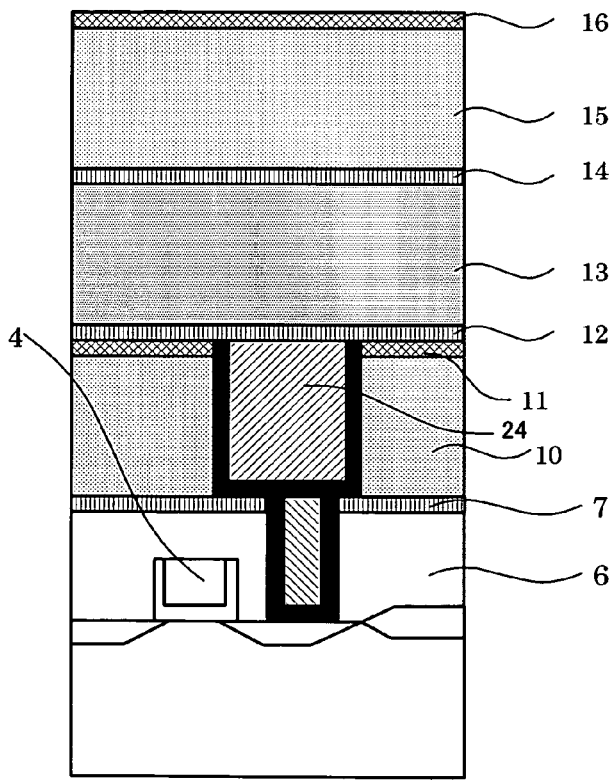
Figure 5:
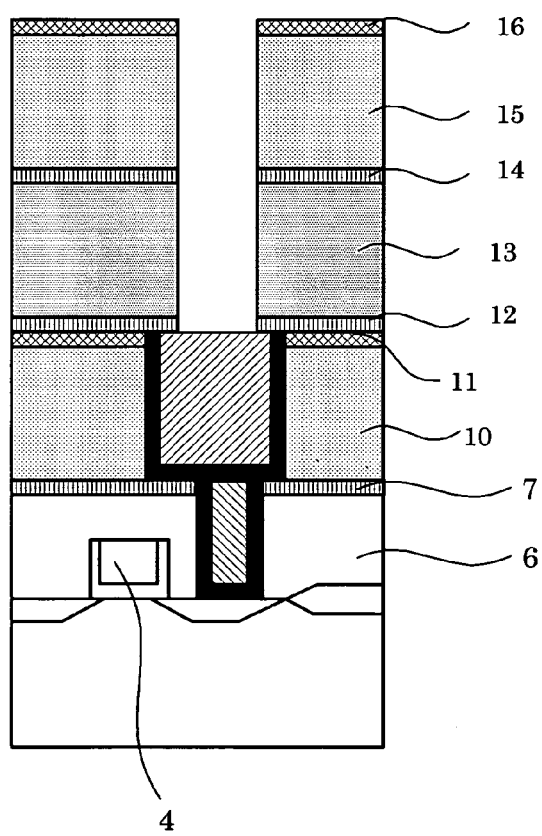
FIG. 5 are schematic diagrams (cross-sectional views) depicting a fabrication method of an example of multi-layer wirings according to the present invention.
Figure 5:
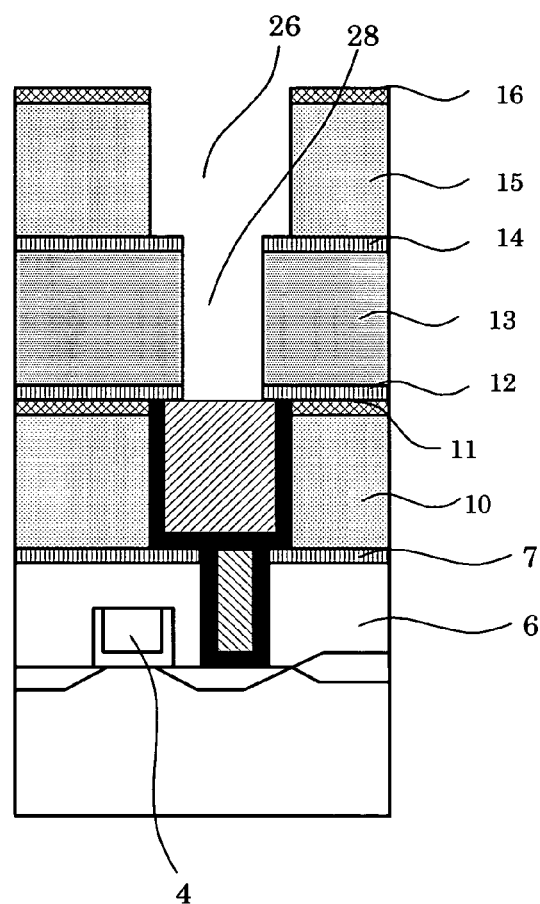
Figure 6:
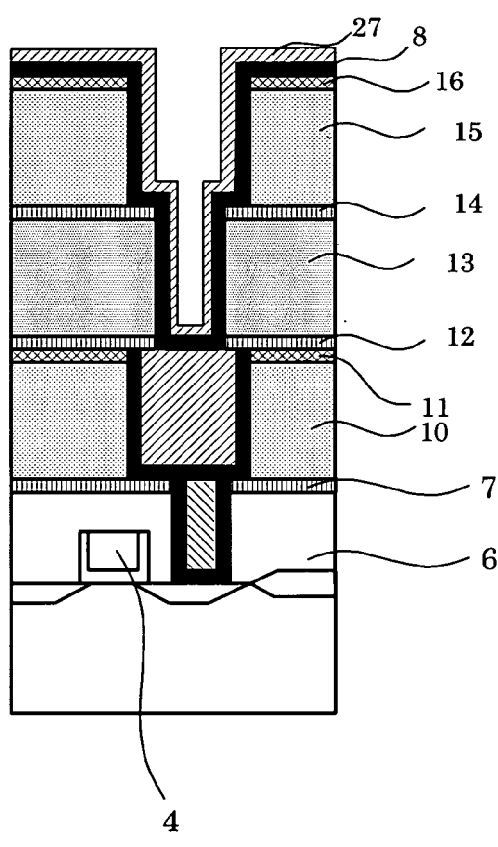
FIG. 6 are schematic diagrams (cross-sectional views) depicting a fabrication method of an example of multi-layer wirings according to the present invention.
Figure 6:
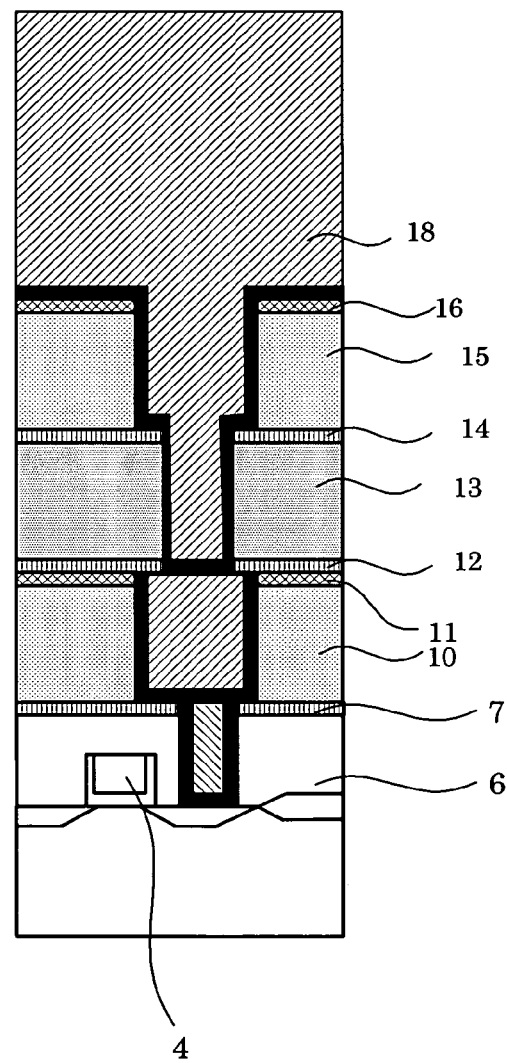

FIG. 1 to FIG. 7 show a fabrication method of an example of multi-layer wirings according to the present invention. First a transistor layer, in which a gate electrode 4 was formed which was isolated by an element separating film 2, and had a source diffusion layer 5a, drain diffusion layer 5b and side wall insulation film 3 (step 1). On this Si wafer 1, an inter-layer insulation film 6 (phosphorous glass) and a stopper film 7 were formed (step 2), and a contact hole 21 was formed for contacting the electrode (step 3). In this contact hole 21, TiN 8 was formed in a thickness of 50 nm by a sputtering method (step 4), then a conductor plug 9 was filled by reduction of a mixture of $WF_6$ and hydrogen (step 5), and portions other than vias 25 were removed by a chemical mechanical polishing method (CMP) (step 6). Then a low dielectric constant film (an insulation film for wiring separation) 10 using an organosilicon compound was formed to be 250 nm above the Si plane, then a TEOS—$SiO_2$ film 11 was layered in a thickness of 50 nm as a protective layer (step 7). Using a resist layer where a first layer of wirings was patterned as a mask, this film was processed by F plasma for which $CF_4/CHF_3$ was used as a source gas (step 8). On this trench 22 for wirings, TiN 8, which functions as a diffusion barrier for the insulation layer against Cu, was formed in a thickness of 50 nm, and a seed layer 23 (Cu, 50 nm thick), which functions as an electrode for electrolytic plating, was formed, both by sputtering (step 9). Then a Cu layer 17 was layered in a thickness of 600 nm by electrolytic plating (step 10), and then metals other than wiring pattern portions, were removed by CMP so as to form a wiring layer 24 (step 11).

Now the Dual Damascene process, in which via layers and wiring layers are formed simultaneously, will be described.

On the first wiring layer 24, an inter-layer film 12 was formed in a thickness of 50 nm using a composition for forming an insulation film under the conditions of No. 5 in Example 1 in order to prevent Cu diffusion, and an SiOC film 13 was formed in a thickness of 250 nm thereon by a plasma CVD method.

Then using silane and ammonia gas, an SiN film 14 was formed in a thickness of 50 nm as a stopper film by a plasma CVD method, and a low dielectric constant film 15 was formed to be 400 nm above the Si plane, then a TEOS—$SiO_2$ film 16 was layered in a thickness of 50 nm as a protective film (step 12). Then using a resist layer in which a via pattern was formed as a mask, $SiO_2$ film 16/low dielectric constant insulation film 15/SiN film 14/SiOC film 13/inter-layer film 12 were processed in this sequence by changing the gas composition using F plasma for which $CF_4/CHF_3$ was used as a source gas (step 13).

Then using a resist layer in which a second wiring pattern was formed as a mask, further processing was performed using an F plasma for which $CF_4/CHF_3$ was used as a source gas (step 14). In this via 28 and wiring trench 26, TiN 8, which functions as a diffusion barrier for the insulation layer against Cu, was formed in a thickness of 50 nm, and a seed layer 27 (Cu in a thickness of 50 nm) which works as an electrode for electrolytic plating, was formed, both by sputtering (step 15). Then a CU layer 18 was layered in a thickness of 1400 nm thereon by electrolytic plating (step 16), and then metals other than the wiring pattern were removed by CMP to form a wiring layer 29 (step 17). Hereafter the above processing steps were repeated, and three layers of wirings were created. Using the prototype multi-layer wirings, a yield for a series of one million vias was checked, and the result was 95% or more. This means that the inter-layer film 12 according to the present invention had a resistance to stress by CMP in step 17. After wire bonding, no damage by bonding pressure was observed. This also proves the stress resistance of the inter-layer film 12. An effective relative dielectric constant was calculated through measuring the comb pattern, and the result was 3.0.

Comparative Example 1

A composition for forming an insulation film (average molecular weight: 1400) having a repeating unit represented by Formula (9) (where Z was a polymer structure of which the main chain was a chain portion substantially containing only carbon, silicon and hydrogen; $R_{11}$ was $CH_2$; $R_{12}$ was $CH_3$; and nitrogen was not included in this repeating unit), was spin coated on a Si substrate to be a 20 nm film thickness, the substrate was prebaked at 250° C. for three minutes, and was heated in an electric furnace of which the atmosphere was a $N_2$ gas (5 volume % of oxygen and 1000 volume ppm of steam), at 400° C. for thirty minutes. Then a thin film thus formed was observed by a scanning microscope, and the generation of cracks was observed.

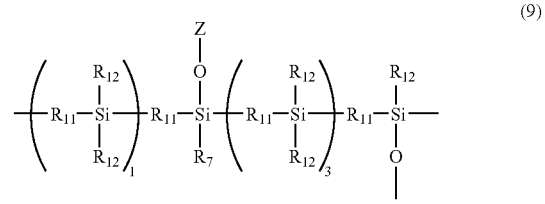

(9)

Comparative Example 2

In the conditions of example 3, a 50 nm thick SiN film formed by plasma CVD using a silane and ammonia gas was used instead of the composition for forming an insulation film under the conditions of No. 5 in Example 1 as the inter-layer film 12. A yield for a series of one million vias was checked using the prototype multi-layer wirings, and the result was 95% or more, which was good, and also no damage by bonding pressure was observed after wire bonding, but the effective relative dielectric constant calculated after measuring the comb pattern was 3.3, which was higher than in Example 3.

What is claimed is:

1. A composition for forming an insulation film, comprising a polymer of which the main chain is a chain portion substantially containing only carbon, silicon and hydrogen, and which contains nitrogen in portions other than the main chain.

2. The composition for forming an insulation film according to claim 1, wherein said nitrogen exists as a constituent represented by Formula 1 in said polymer

3. The composition for forming an insulation film according to claim 1, wherein the molar ratio of nitrogen and silicon in said polymer is in a range of $0.1 \leq N/Si \leq 0.5$.

4. The composition for forming an insulation film according to claim 1, comprising at least one of a silicon-containing polymer having a repeating unit represented by Formula 2 and a silicon-containing polymer having a repeating unit represented by Formula 3,

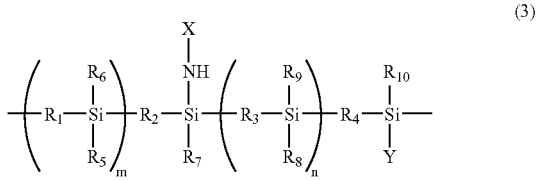

(where R and $R_1$ to $R_4$ in Formula 2 and Formula 3 are, independently from each other, an alkylene group with a carbon number of 1 to 20, an alkenylene group or alkynylene group with a carbon number of 2 to 20, an alkenylalkylene group or alkynylalkylene group with a carbon number of 3 to 20, or an arylene group with a carbon number of 6 to 20; $R_5$ to $R_{10}$ are, independently from each other, hydrogen, an alkyl group with a carbon number of 1 to 20, an alkenyl group or alkynyl group with a carbon number of 2 to 20, an alkenylalkyl group or alkynylalkyl group with a carbon number of 3 to 20, or an aryl group with a carbon number of 6 to 20; m and n are, independently from each other, an integer in a range of 0 to 20; X is hydrogen or a silicon-containing group which directly bonds with a corresponding NH, independently between Formula 2 and Formula 3; and Y is $NH_2$ or an NH-containing group which directly bonds with a corresponding Si, independently between Formula 2 and Formula 3).

5. The composition for forming an insulation film according to claim 1, wherein $R_1$ to $R_4$ in Formula 3 are, independently from each other, an alkylene group with a carbon number of 1 to 3, an alkenylene group or alkynylene group with a carbon number of 2 to 4, an alkenylalkylene group or alkynylalkylene group with a carbon number of 3 to 6, or an arylene group with a carbon number of 6 to 10.

6. The composition for forming an insulation film according to claim 1, wherein $R_5$ to $R_{10}$ in Formula 3 are, independently from each other, an alkyl group with a carbon number of 1 to 3, an alkenyl group or alkynyl group with a carbon number of 2 to 4, an alkenylalkyl group or alkynylalkyl group with a carbon number of 3 to 6, or an aryl group with a carbon number of 6 to 10.

7. The composition for forming an insulation film according to claim 4, wherein m and n in Formula 3 are, independently from each other, an integer in a range of 0 to 10.

8. An insulation film forming method for a semiconductor device, comprising:
coating the composition for forming an insulation film according to claim 1 on a silicon substrate; and
heating said silicon substrate at 80 to 500° C. for 2 to 180 minutes.

9. The insulation film forming method for a semiconductor device according to claim 8, wherein at least a part of said heating is performed in an atmosphere containing oxygen and steam.

10. The insulation film forming method for a semiconductor device according to claim 9, wherein the oxygen concentration in said atmosphere is in a range of 100 volume ppm to 40 volume %.

11. The insulation film forming method for a semiconductor device according to claim 9, wherein the steam concentration in said atmosphere is in a range of 10 volume ppm to 4 volume %.

12. An insulation film for a semiconductor device obtained by heating the composition for forming an insulation film according to claim 1.

13. An insulation film for a semiconductor device formed by the insulation film forming method for a semiconductor device according to claim 8.

14. The insulation film for a semiconductor device according to claim 12, wherein the oxygen content is in a range of 1 to 50 molar % range.

15. The insulation film for a semiconductor device according to claim 12, wherein the relative dielectric constant is 3.0 or less and Young's modulus is 10 GPa or more.

16. A semiconductor device fabrication method, comprising:
forming an insulation film for a semiconductor device using the method according to claim 8; and
polishing wirings of the semiconductor device by chemical mechanical polishing thereafter.

17. A semiconductor device fabrication method, comprising:
forming an insulation film for a semiconductor device using the method according to claim 8; and
forming an insulation film of which the relative dielectric constant is 2.5 or less, immediately before or immediately after forming said insulation film.

18. The semiconductor device fabrication method according to claim 17, wherein said insulation film the relative dielectric constant of which is 2.5 or less is formed by processes including:
coating a liquid composition comprising an organosilicon compound obtained by hydrolysis in the presence of a tetraalkylammonium hydroxide (TAAOH) on a substrate; and heating said substrate at a temperature in an 80 to 450° C. range.

19. A semiconductor device fabricated by the fabrication method according to claim 16.

20. A semiconductor device, wherein the insulation film for a semiconductor device according to claim 12 and an insulation film of which the relative dielectric constant is 2.5 or less are layered.

* * * * *